(12) United States Patent
Iyer et al.

(10) Patent No.: US 8,471,331 B2
(45) Date of Patent: Jun. 25, 2013

(54) METHOD OF MAKING AN INSULATED GATE SEMICONDUCTOR DEVICE WITH SOURCE-SUBSTRATE CONNECTION AND STRUCTURE

(75) Inventors: Dorai Iyer, Phoenix, AZ (US); Gordon M. Grivna, Mesa, AZ (US); Jeffrey Pearse, Chandler, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 116 days.

(21) Appl. No.: 13/210,238

(22) Filed: Aug. 15, 2011

(65) Prior Publication Data

US 2013/0043526 A1 Feb. 21, 2013

(51) Int. Cl.
 *H01L 29/739* (2006.01)
(52) U.S. Cl.
 USPC ............................. 257/330; 257/334
(58) Field of Classification Search
 USPC .................................. 257/330, 334
 See application file for complete search history.

(56) References Cited

U.S. PATENT DOCUMENTS

| | | | |
|---|---|---|---|
| 4,738,936 A | 4/1988 | Rice | |
| 5,021,845 A | 6/1991 | Hashimoto | |
| 5,023,196 A | 6/1991 | Johnsen | |
| 5,134,448 A | 7/1992 | Johnsen | |
| 5,473,176 A | 12/1995 | Kakumoto | |
| 5,710,443 A | 1/1998 | Blanchard | |
| 5,760,440 A | 6/1998 | Kitamura | |
| 5,945,708 A | 8/1999 | Tihanyi | |
| 6,124,612 A | 9/2000 | Tihanyi | |
| 6,284,604 B1 | 9/2001 | Tihanyi | |
| 6,373,097 B1 | 4/2002 | Werner | |
| 6,459,142 B1 | 10/2002 | Tihanyi | |
| 6,576,953 B2 | 6/2003 | Hirler | |
| 7,633,120 B2 | 12/2009 | Hebert | |
| 8,008,716 B2 * | 8/2011 | Lui et al. | 257/332 |
| 8,227,315 B2 * | 7/2012 | Hebert | 438/270 |
| 8,334,564 B2 * | 12/2012 | Hirler et al. | 257/328 |
| 2004/0145013 A1 | 7/2004 | Pfirsch | |
| 2005/0173741 A1 | 8/2005 | Spring | |
| 2005/0194636 A1 | 9/2005 | Kinzer | |
| 2006/0043474 A1 | 3/2006 | Kinzer | |
| 2006/0113589 A1 * | 6/2006 | Jones | 257/330 |
| 2008/0035987 A1 * | 2/2008 | Hebert | 257/330 |

* cited by examiner

*Primary Examiner* — Benjamin Sandvik
(74) *Attorney, Agent, or Firm* — Kevin B. Jackson (57) ABSTRACT

In one embodiment, a source-down vertical insulated gate field effect transistor includes a source contact that is buried within a trench gate structure. Dopant of a first conductivity type is diffused from the conductive source contact into an adjacent semiconductor layer that has a second and opposite conductivity type to form source regions. A self-aligned metal contact is formed within the trench gate structure to short the source contact and the source regions to an underlying substrate.

20 Claims, 12 Drawing Sheets

METHOD OF MAKING AN INSULATED GATE SEMICONDUCTOR DEVICE WITH SOURCE-SUBSTRATE CONNECTION AND STRUCTURE

BACKGROUND OF THE INVENTION

This document relates generally to semiconductor devices, and more specifically to insulated gate structures and methods of formation.

In a typical insulated gate field effect transistor (IGFET) device, a gate electrode provides turn-on and turn-off control with the application of an appropriate gate voltage. By way of example, in an n-type enhancement mode IGFET device turn-on occurs when a conductive n-type inversion layer (i.e., channel region) is formed in a p-type body region in response to the application of a positive gate voltage, which exceeds an inherent threshold voltage. The inversion layer connects n-type source regions to n-type drain regions and allows for majority carrier conduction between these regions.

There is a class of IGFET devices where the gate electrode is formed in a trench that extends downward from a major surface of a semiconductor material such as silicon. Current flow in this class of devices is primarily vertical, and, as a result, device cells can be more densely packed. All else being equal, increased cell density increases the current carrying capability and reduces on-resistance of the device.

There is a further class of IGFET devices in which the drain terminal is placed on the front side of the substrate (i.e., the side where active devices typically are formed), and the source terminal is placed on the back side of the substrate. Such configurations may be referred to as "source-down" or "source-substrate connection" devices. Source-down devices have several advantages in some applications including improved circuit integration (for example, co-integration of high-side and low-side devices) and better heat dissipation.

However, source-down devices have several manufacturing related challenges. Specifically, in order to ensure that a parasitic bipolar transistor formed by the source, body, and substrate regions is not turned on, the buried source region must be shorted to the body region in a reliable and cost effective manner. In addition, prior art source-down devices often require up to ten (10) masking steps, which adds significant manufacturing costs.

Accordingly, structures and methods of manufacture are needed to provide cost-effective and reliable IGFET devices having a source-down connection configuration. Additionally, it would be beneficial if such structures and methods produce a device having improved switching and blocking voltage performance.

For simplicity and clarity of illustration, elements in the figures are not necessarily drawn to scale, and the same reference numbers in different figures denote generally the same elements. Additionally, descriptions and details of well-known steps and elements may be omitted for simplicity of the description. As used herein current-carrying electrode means an element of a device that carries current through the device—such as a source or a drain of an MOS transistor, or an emitter or a collector of a bipolar transistor or a cathode or anode of a diode. Also, a control electrode means an element of the device that controls current through the device—such as a gate of a MOS transistor, or a base of a bipolar transistor. Although the devices are explained herein as certain N-channel devices, a person of ordinary skill in the art will appreciate that P-channel devices and complementary devices are also possible in accordance with the present description. For clarity of the drawings, doped regions of device structures are illustrated as having generally straight-line edges and precise angular corners. However, those skilled in the art understand that due to the diffusion and activation of dopants, the edges of doped regions are generally not straight lines and the corners are not precise angles.

Further, the term "major surface" when used in conjunction with a semiconductor region or substrate means the surface of the semiconductor region or substrate that forms an interface with another material such as a dielectric or insulator, a conductor, or a polycrystalline semiconductor. The major surface can have a topography that changes in the x, y, and z directions.

DETAILED DESCRIPTION OF THE DRAWINGS

In general, the present description pertains to an insulated-gate semiconductor device having a source-substrate connection or source-down configuration. In one embodiment, a polycrystalline semiconductor source contact region can be formed in a floor portion of a trench gate structure. Source regions of a first conductivity type are laterally diffused from the polycrystalline semiconductor source contact region into an adjacent semiconductor layer of a second conductivity type opposite to the first conductivity type, which is configured as a body contact layer. In one embodiment, a source contact plug and a metal silicide region can be formed in proximity to the floor portion of the trench gate structure to provide a source contact to an underlying semiconductor substrate and to short the source regions to the adjacent semiconductor layer. The underlying substrate can have a conductivity type that is opposite to the conductivity type of the source and drain regions. In a further embodiment, thick dielectric regions can separate a gate electrode from the drain region. The device can be manufactured with as few as three (3) photo-lithography or patterning steps.

Figure 1:
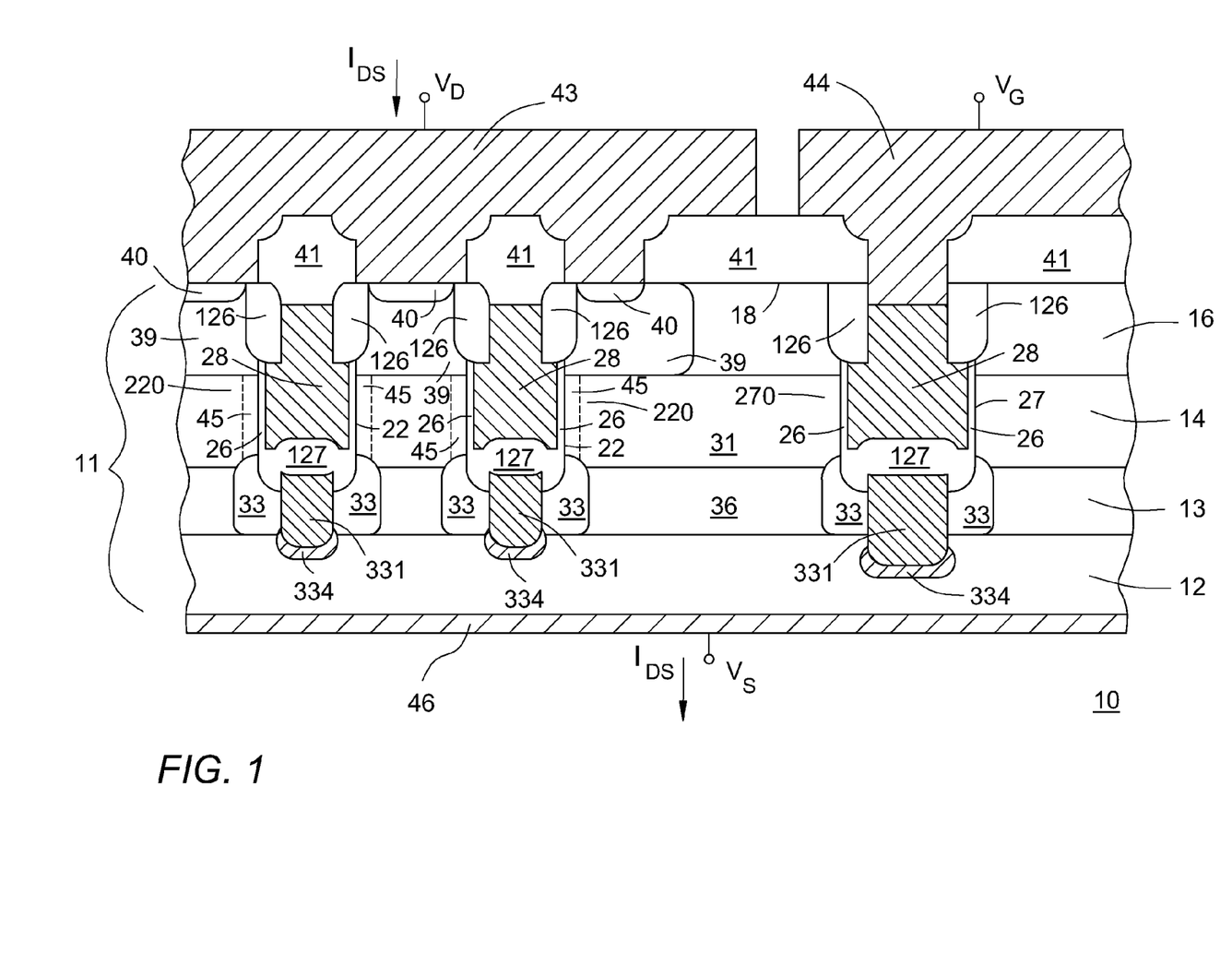
FIG. 1 illustrates a partial cross-sectional view of a semiconductor structure in accordance with an embodiment of the present invention.

FIG. 1 shows a partial cross-sectional view of a semiconductor device 10 or cell 10 having a source-down or source-substrate connection. Device 10 can comprise a plurality of such devices integrated as a discrete device and/or integrated with other functionality as a power integrated circuit. Device 10 will be described as an n-channel device, but it is understood that device 10 can be a p-channel device by, for example, reversing the described conductivity types.

In this embodiment, device 10 can be configured as a vertical power MOSFET structure, but it is understood that this description applies as well to insulated gate bipolar transistors (IGBT) and the like. Device 10 includes a region of semiconductor material, semiconductor material, or semiconductor region 11, which can be, for example, a p+ conductivity type silicon substrate 12. Substrate 12 can be doped with boron. In the embodiment shown, substrate 12 provides a source contact or a first current carrying contact for device 10.

A semiconductor layer 13 can be formed overlying substrate 12. In one embodiment, semiconductor layer 13 can be formed using semiconductor epitaxial growth techniques. In one embodiment, semiconductor layer 13 is a p conductivity type layer. In one embodiment, which is suitable for a 60 volt $BV_{DSS}$, semiconductor layer 13 can have a concentration of about $1.0 \times 10^{18}$ to about $1.0 \times 10^{19}$ atoms/cm$^3$ and can be about 0.5 to about 1.0 microns in thickness. In the present embodiment, semiconductor layer 13 forms or is configured as a body contact layer or body contact 36 for device 10.

A semiconductor layer 14 can be formed overlying semiconductor layer 13. In one embodiment, semiconductor layer 14 can be formed using semiconductor epitaxial growth techniques. In one embodiment, semiconductor layer 14 can be a p conductivity type layer and can have a lower dopant concentration than that of semiconductor layer 13. Semiconductor layer 14 has a dopant concentration suitable for forming inversion layers or channel regions 45 of device 10. In one embodiment, semiconductor layer 14 can have a dopant concentration of about $5.0 \times 10^{16}$ to about $1.5 \times 10^{17}$ atoms/cm$^3$ and can be about 0.5 to about 1.5 microns thick. In the present embodiment, semiconductor layer 14 forms or is configured as a PHV (P-type High Voltage) layer, a PHV region, or body region 31 for device 10.

Device 10 further includes a semiconductor layer 16 formed overlying semiconductor layer 14. In one embodiment, semiconductor layer 16 can be formed using semiconductor epitaxial growth techniques. In one embodiment, semiconductor layer 16 can be a p− conductivity type layer, and can have a lower dopant concentration than that of semiconductor layer 14. In one embodiment, semiconductor layer 16 can have a dopant concentration of about $1.0 \times 10^{15}$ to about $1.0 \times 10^{16}$ atoms/cm$^3$ and can be about 3.0 to about 5.0 microns thick. In another embodiment, semiconductor layer 16 can be n conductivity type.

Device 10 further includes trench structures or active trench structures 220 and a contact trench structure 270, which can be formed at least in part within region of semiconductor material 11 and can extend from a major surface 18 into region of semiconductor material 11. In one embodiment, trench structures 220 and 270 include gate control structures, which can include gate dielectric layers 26 and gate electrodes or control electrodes 28. In one embodiment, gate dielectric layers 26 comprise oxide, nitride, tantalum pentoxide, titanium dioxide, barium strontium titanate, hafnium oxide, combinations thereof, or the like. In one embodiment, gate dielectric layers 26 comprise silicon oxide and can have a thickness from about 0.01 microns to about 0.1 microns. In one embodiment, trench structures 220 and 270 can include dielectric regions 126, which can be thicker than gate dielectric layers 26. In one embodiment, dielectric regions 126 comprise silicon oxide and can have a thickness from about 0.05 microns to about 0.5 microns. In one embodiment, dielectric regions 126 and adjoining portions of gate electrode 28 in trench structures 220 are configured as a field plate to improve breakdown voltage performance of device 10. Also, dielectric regions 126 help reduce gate-to-drain capacitance of device 10. In an alternative embodiment, trench structure 270 can be configured as a termination trench.

Trench structures 220 further include source contacts, source contact plugs, conductive plugs or conductive regions 331, such as polycrystalline semiconductor regions or plugs of polycrystalline semiconductor material, formed in a lower or floor portion of trench structures 220 and 270. In accordance with the present embodiment, conductive regions 331 comprise a plug or fill material as shown, for example, in FIG. 1 as opposed to a thin film or lining of conductive material that is covered with a dielectric material, which allows for higher current flow. In one embodiment, conductive regions 331 can comprise a polysilicon region doped with an n+ conductivity type dopant, such as phosphorous or arsenic. In another embodiment, conductive regions 331 can comprise metal plug regions, such as tungsten plugs or a combination of doped polysilicon and metal plugs. In one embodiment, the polysilicon can line the lower surfaces of trenches 22 and 27 to provide dopant with the metal plug regions formed adjacent the polysilicon liner. Insulation or dielectric regions 127 are formed overlying or surrounding conductive regions 331 and are configured to isolate conductive regions 331 from gate electrodes 28. In one embodiment, dielectric regions 127 can have a thickness between about 0.05 microns to about 0.5 microns. In one embodiment, dielectric regions 127 can comprise an oxide, a nitride, combinations thereof, or the like. In one embodiment, dielectric regions 127 are thicker than gate dielectric layers 26.

Device 10 further includes source regions 33 formed within semiconductor layer 13 and adjacent to conductive regions 331 and substrate 12. In one embodiment, source regions 33 may directly abut conductive regions 331 and/or substrate 12. In one embodiment, source regions 33 may overlap into or merge into conductive regions 331 and/or substrate 12. In one embodiment, source regions 33 are formed partially within semiconductor layer 14 or body region 31. In one embodiment, source regions 33 can be formed by laterally diffusing dopant from polycrystalline semiconductor regions 331, or from some other dopant sources such as doped glass or the like, into semiconductor layer 13 and into a portion of semiconductor layer 14. In accordance with the present embodiment, by controlling the lateral diffusion of source regions 33 into semiconductor layer 13, device 10 can have variable source and body contact areas. In one embodiment, source regions 33 abut semiconductor substrate 12.

In accordance with the present embodiment, conductive regions 334 are formed adjacent to conductive regions 331. In one embodiment, conductive regions 334 comprise a material that can withstand required process temperatures used to form other regions of device 10. In one embodiment, conductive regions 334 can comprise a metal silicide, such as titanium, tantalum, tungsten, or the like. In one embodiment, a liner or barrier layer (for example, titanium/titanium-nitride or the like) can be formed between the metal silicide and the floor portions of trenches 22 and 27. Conductive regions 334 are configured to short conductive regions 331 and source regions 33 to substrate 12. In accordance with the present embodiment, conductive regions 331 and conductive regions 334 are configured to enhance current flow through source regions 33 and substrate 12, which helps reduce on-resistance. In one embodiment, conductive regions 334 can be self-aligned to trench structures 220.

Device 10 can further include an n type region or regions 39 formed in a portion semiconductor layer 16 and extending from major surface 18. Regions 39 can be configured as a drain region for device 10. In one embodiment, regions 39 have a dopant concentration selected to withstand a desired $BV_{DSS}$ characteristic. In one embodiment, regions 39 may have a dopant concentration of n type dopant from about $1.0 \times 10^{16}$ atoms/cm$^3$ to about $1.0 \times 10^{17}$ atoms/cm$^3$. In one embodiment, regions 39 have a graded or stepped dopant profile with the dopant concentration gradually decreasing proximate to the interface between semiconductor layer 14 and semiconductor layer 16. In one embodiment, region 39 has a depth of about 3 microns to about 5 microns and can extend through semiconductor layer 16 into semiconductor layer 14. In an optional embodiment, n+ type regions 40 can be formed within regions 39 to improve electrical contact to conductive regions 43.

An interlayer dielectric (ILD), dielectric, or insulator layer 41 is formed overlying major surface 18 and above trench structures 220. In one embodiment, dielectric layer 41 comprises a silicon oxide and can have a thickness from about 0.4 microns to about 1.0 microns. In one embodiment, dielectric layer 41 comprises a deposited silicon oxide doped with phosphorous or boron and phosphorous. In one embodiment, dielectric layer 41 can be planarized to provide a more uniform surface topography, which improves manufacturability.

Conductive regions 43 and 44 are formed overlying major surface 18 and within openings or vias formed in dielectric layer 41 to provide electrical contact to drain regions 39 and gate conductive layers 28 through trench contract structure 270, respectively. In one embodiment, conductive regions 43 and 44 can comprise conductive plugs or plug structures. In one embodiment, conductive regions 43 and 44 can comprise a conductive barrier structure or liner plus a conductive fill material. In one embodiment, the barrier structure includes a metal/metal-nitride configuration such as titanium/titanium-nitride or the like. In another embodiment, the barrier structure can further include a metal-silicide structure. In one embodiment, the conductive fill material includes tungsten. In one embodiment, conductive regions 43 and 44 are planarized to provide a more uniform surface topography. When conductive regions 43 and 44 comprise plug structures, an additional conductive layer can be formed overlying conductive regions 43 and 44. For example, the additional conductive layer may comprise aluminum, an aluminum alloy, a solderable metal scheme, or the like. In another embodiment, conductive regions 43 and 44 can comprise a barrier metal scheme and aluminum, an aluminum alloy, a solderable metal scheme, or the like.

Conductive regions 43 and 44 can be configured to provide electrical connection between the individual device components of device 10 and a next level of assembly, such as a package board, lead frame, a conductive structure, or an insulated structure. In one embodiment, conductive region 43 is configured as a drain electrode or terminal. In one embodiment, conductive region 44 is configured as a control or gate electrode or terminal. In one embodiment, a further passivation layer (not shown) can be formed overlying conductive regions 43 and 44.

A conductive layer 46 can be formed overlying a surface of region semiconductor material 11 opposite to major surface 18. In one embodiment, conductive layer 46 can be a solderable metal structure—such as titanium-nickel-silver, chromium-nickel-gold, or the like—and is configured as a source electrode or terminal.

In one embodiment, the operation of device 10 proceeds as follows. Assume that source electrode (or input terminal) 46 (which is electrically connected to polycrystalline semiconductor regions 331 through substrate 12 and contact regions 334) is operating at a potential Vs of zero volts, gate electrodes 28/44 receive a control voltage $V_G$ of 4.5 volts, which is greater than the conduction threshold of device 10, and drain electrode (or output terminal) 43 operates at a drain potential $V_D$ of less than 2.0 volts. The values of $V_G$ and $V_S$ cause body region 31 (or semiconductor layer 14) adjacent to gate electrodes 28 to invert to form channels 45, which electrically connect source regions 33 to drain region 39. A device current $I_{DS}$ flows from drain electrode 43 and is routed through drain region 39, channels 45, source regions 33, polycrystalline semiconductor regions 331, contact regions 334, and substrate 12 to source electrode 46. In one embodiment, $I_{DS}$ is on the order of 10.0 amperes. To switch device 10 to the off state, a control voltage $V_G$ of less than the conduction threshold of device 10 is applied to gate electrodes 28 (e.g., $V_G$<2.5 volts). This application of lower voltage removes channels 45, and $I_{DS}$ no longer flows through device 10.

Figure 2:
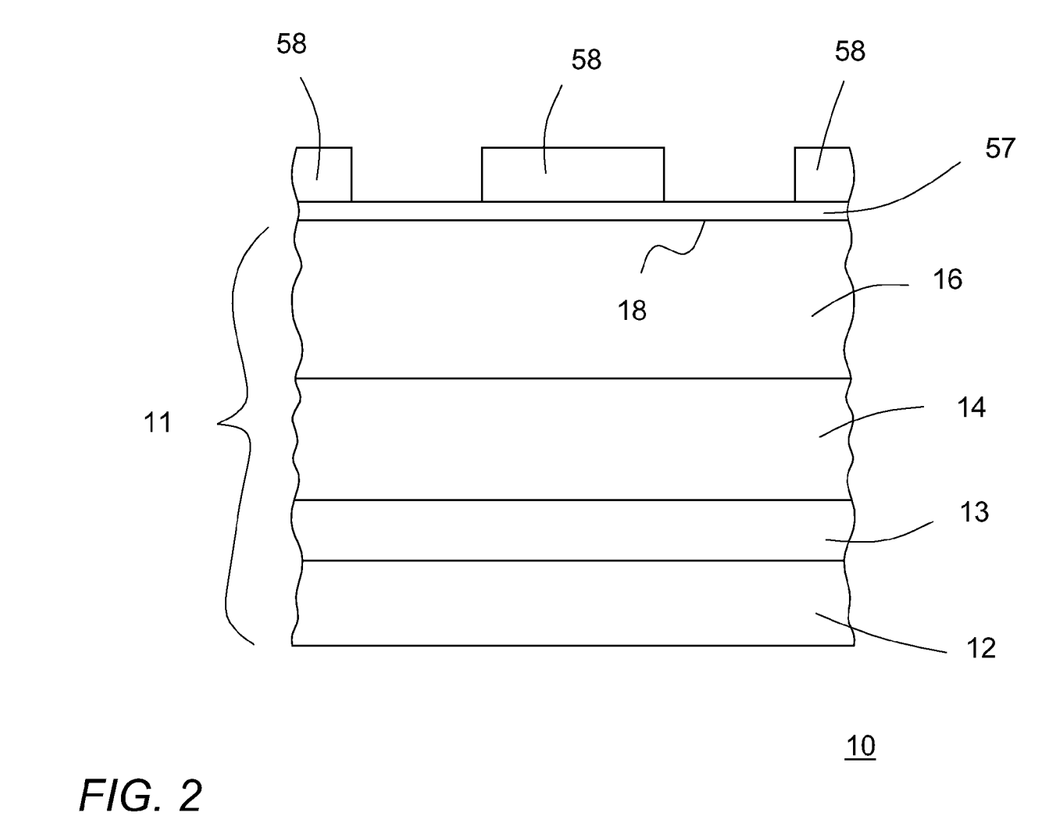
FIGS. 2-6 illustrate partial cross-sectional views of the semiconductor structure of FIG. 1 at various stages of fabrication.

FIGS. 2-6 show partial cross-sectional views of device 10 at various stages of manufacture. In FIGS. 2-6, only trench structures 220 are shown, but it is understood that similar processing steps or methods can be used to form contact trench structure 270. In FIG. 2, region of semiconductor material 11 is formed or separately provided, which can include p type substrate 12 and p type semiconductor layers 13, 14, and 16 as described previously. At this step, a protective structure or hard mask layer 57 can be formed adjacent to major surface 18. In one embodiment, hard mask layer 57 can be several different layers of material. In one embodiment, hard mask layer 57 can include about 0.05 microns to about 0.08 microns of silicon oxide, about 0.15 microns to about 0.25 microns of silicon nitride, and about 0.15 microns to about 0.25 microns of deposited silicon oxide. Next, in a first masking step a protective layer 58, such as a photoresist material, is formed overlying hard mask layer 57 and openings formed that expose segments of hard mask layer 57. The exposed segments of hard mask layer 57 are then removed to expose portions of semiconductor layer 16.

Figure 3:
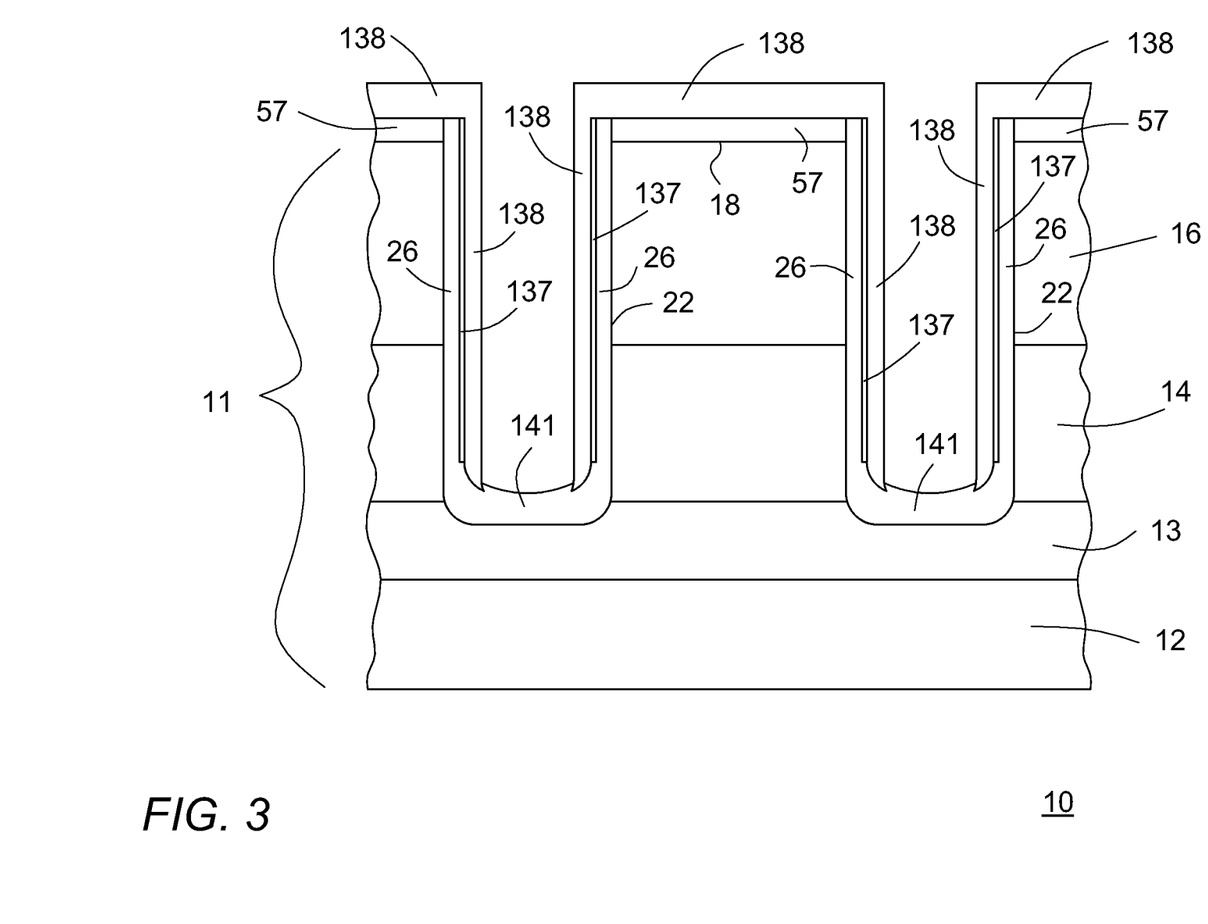

Trenches 22 are then formed in region of semiconductor material 11 extending from major surface 18 as shown in FIG. 3. Protective layer 58 may be left in place while trenches 22 are formed or may be removed prior to the formation of trenches 22. By way of example, trenches 22 can be formed using plasma etching techniques with fluorocarbon chemistry (for example, $SF_6/O_2$) or hydrogen bromide chemistry. In one embodiment, trenches 22 can be etched in a first increment to a depth proximate to the interface between semiconductor layers 13 and 14. Next, exposed surfaces of trenches 22 can be cleaned, and a temporary or sacrificial layer (not shown) can be formed overlying the exposed and cleaned surfaces. In one embodiment, a thermal oxide layer can be formed and then can be subsequently removed. The removal step also can remove at least portions of any exposed oxide layer that is part of hard mask layer 57.

Next, gate dielectric layer 26 can be formed overlying sidewall surfaces and the floor portions of trenches 22. In one embodiment, gate dielectric layer 26 can comprise silicon oxide, and it can have a thickness from about 0.01 microns to about 0.1 microns. A polycrystalline semiconductor layer 137 can then be formed adjacent to gate dielectric layer 26. In one embodiment, polycrystalline semiconductor layer 137 can be polysilicon and can have a thickness from about 0.04 microns to about 0.07 microns. In a next step, polycrystalline semiconductor layer 137 can be anisotropically etched to remove a portion of polycrystalline semiconductor layer 137 from the floor portions of trenches 22. In one embodiment, a dry etch process can be used with hydrogen bromide chemistry to etch polycrystalline semiconductor layer 137 when it comprises polysilicon. A dielectric layer 138 can then be formed adjacent polycrystalline semiconductor layer 137. In one embodiment, dielectric layer 138 can comprise a silicon nitride, and it can have a thickness of about 0.04 microns to about 0.07 microns. Dielectric layer 138 can then be anisotropically etched to remove a portion of dielectric layer 138 from the floor portions of trenches 22. In one embodiment, a dry etch process can be used with fluorine chemistry to etch dielectric layer 138 when it comprises silicon nitride. Next, dielectric regions 141 can be formed adjacent the floor portions of trenches 22. In one embodiment, dielectric regions 141 can comprise silicon oxide, and dielectric regions 141 can have a thickness from about 0.09 microns to about 0.02 microns.

Figure 4:
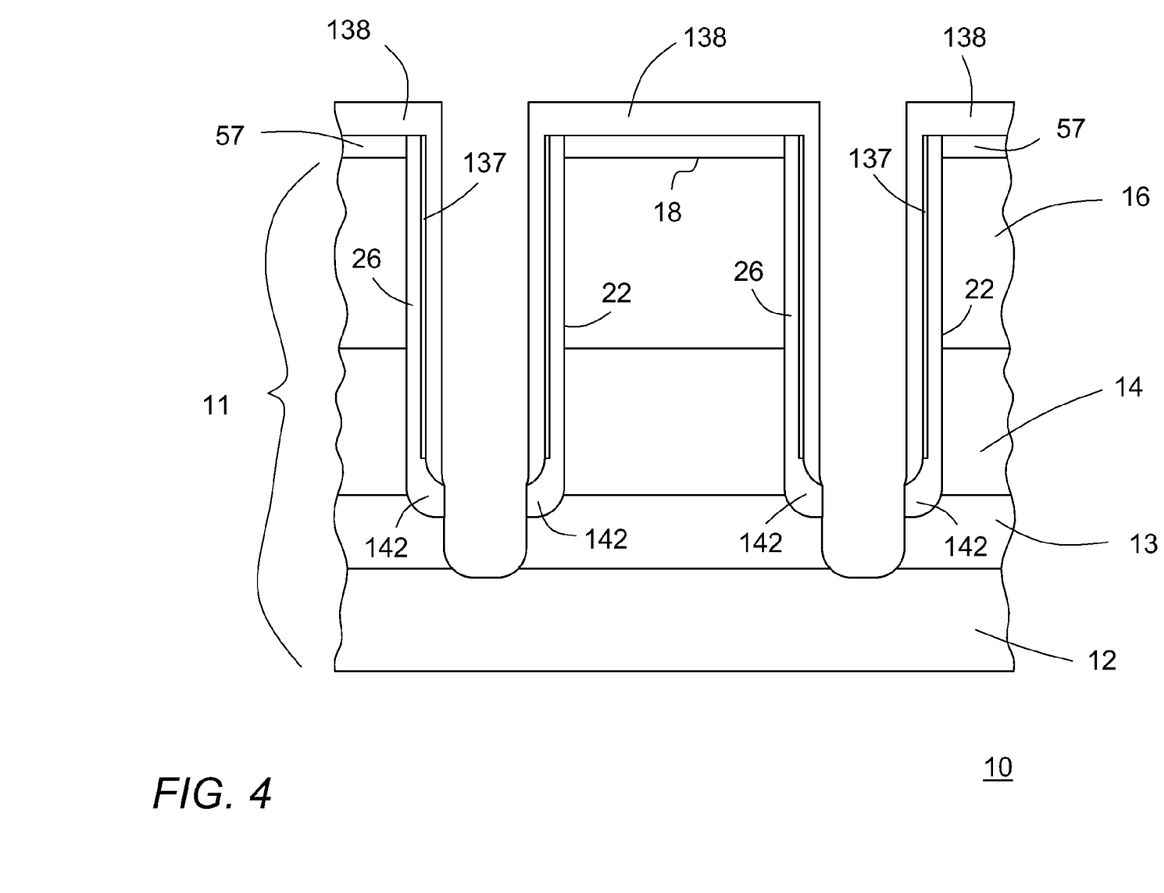

FIG. 4 shows a partial cross-sectional view of device 10 after subsequent processing. Trenches 22 can be etched in a second increment to deepen trenches 22 within region of semiconductor material 11. In one embodiment, the second increment can place trenches 22 proximate to the interface between substrate 12 and semiconductor layer 13. In one embodiment, an anisotropic dry etch can be used with fluorine chemistry to remove portions of dielectric regions 141 and semiconductor layer 13. The dry etch step can leave portions 142 of dielectric regions 141, which can have parts that are thicker than gate dielectric layers 26.

Figure 5:
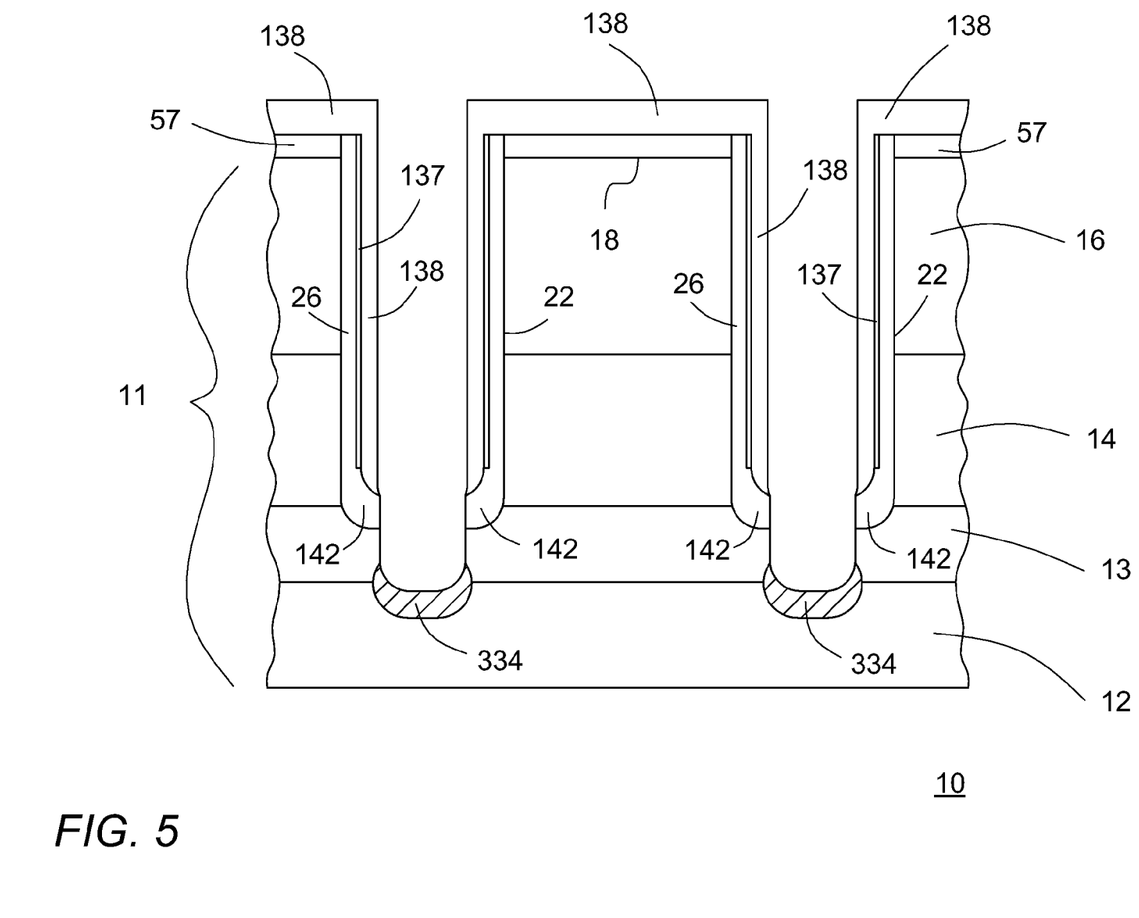

FIG. 5 shows a partial cross-sectional view of device 10 after further processing to form conductive regions 334 adjacent substrate 12. In one embodiment, a metal film can be deposited adjacent the floor portions of trenches 22 using, for example, sputter deposition techniques. The metal film can comprise a material that is stable at elevated temperatures used subsequently to form other features of device 10. In one embodiment, the metal film can be titanium, tantalum, molybdenum, or tungsten. In one embodiment, the metal film can then be sintered at an elevated temperature to form a silicide or self-aligned silicide region configured as conductive regions 334. Any residual metal can then be removed. By way of example, when tantalum is used, the metal film can be sintered at approximately 750 degrees Celsius, and then the residual metal can be stripped using, for example, an alkaline hydrogen peroxide solution. In another embodiment, a co-deposited silicide layer can be used to form conductive regions 334.

Figure 6:
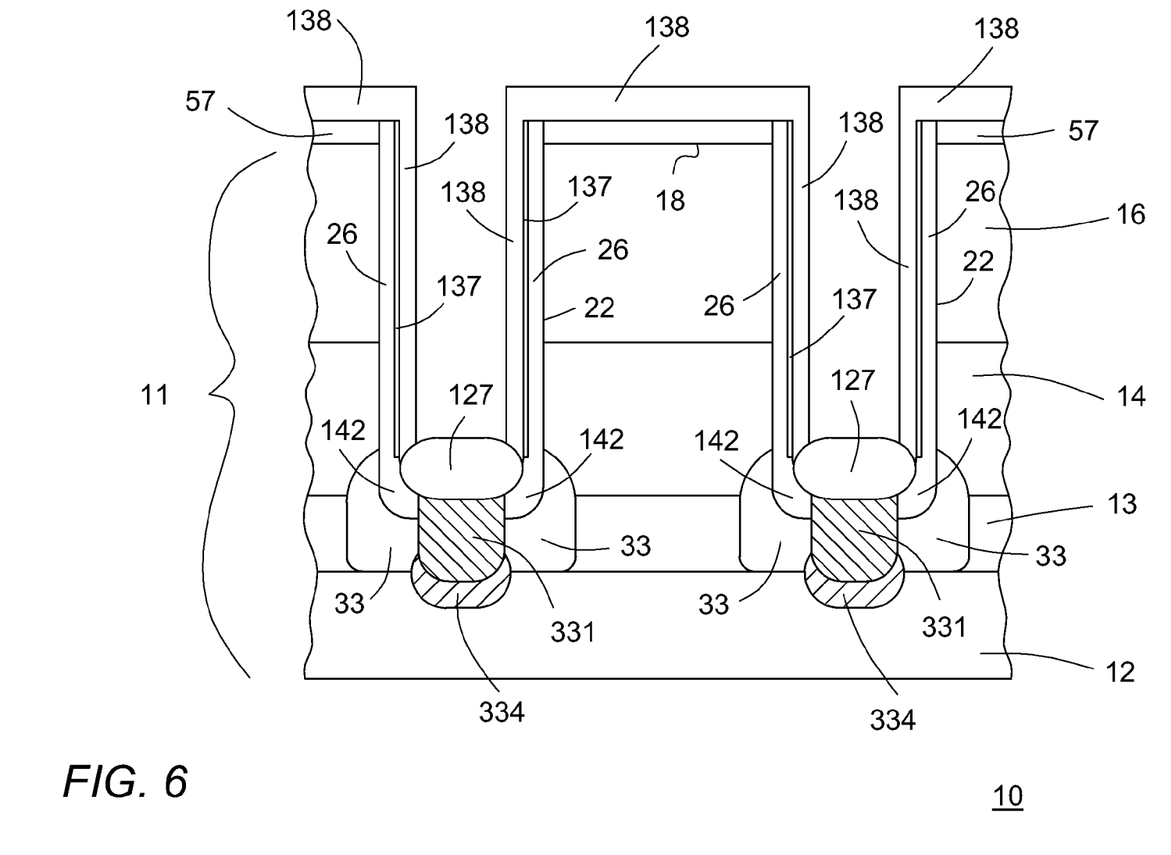

FIG. 6 is a partial cross-sectional view of device 10 after more processing to form conductive regions 331 and source regions 33. In one embodiment, conductive regions 331 can be formed by depositing an n+ type polycrystalline semiconductor material at least within trenches 22 and by removing portions of the polycrystalline semiconductor material. In one embodiment, the polycrystalline semiconductor material can be recessed within trenches to a location proximate to portions 142 of dielectric regions 141. In one embodiment, the polycrystalline semiconductor material can be n+ type doped polysilicon, which can be etched with a hydrogen bromide chemistry to form conductive regions 331 within trenches 22. In another embodiment, selective epitaxial growth techniques can be used to form conductive regions 331. In another embodiment phosphorous doped glass can be deposited and used as a diffusion source then removed. In accordance with the present embodiment, the n type dopant within conductive regions 331 can be diffused into semiconductor layers 13 and 14 to form source regions 33. Either simultaneously forming with source regions 33 or thereafter, dielectric regions 127 can be formed adjacent conductive regions 331. In one embodiment, dielectric regions 127 can be silicon oxide and can have a thickness between about 0.1 microns and about 0.3 microns.

Figure 7:
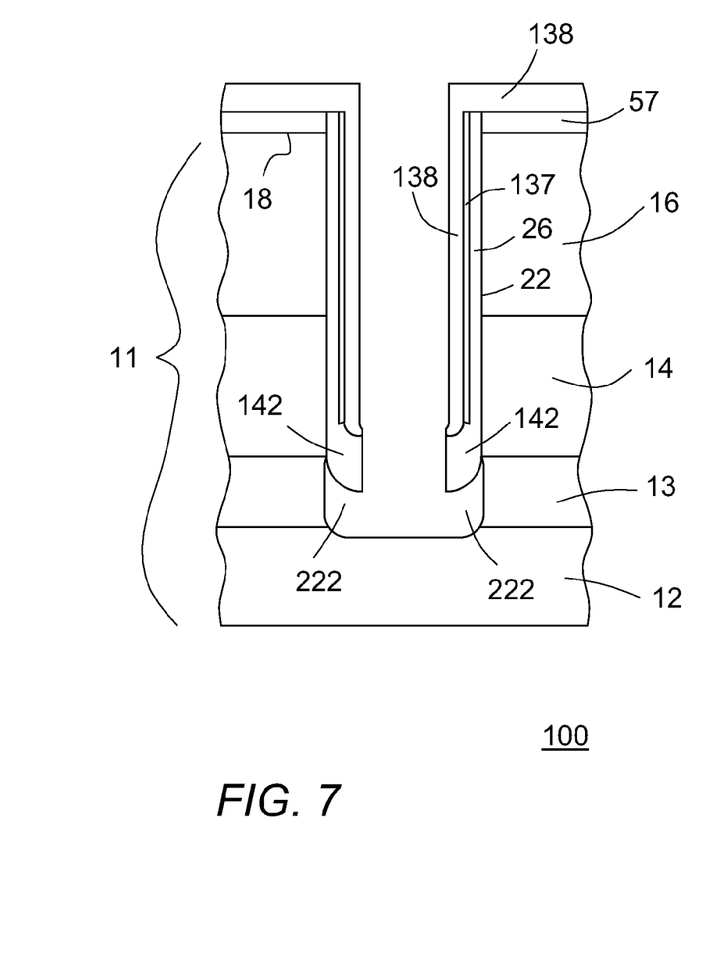
FIGS. 7-10 illustrate partial cross-sectional views of a semiconductor structure in accordance with another embodiment of the present invention at various stages of fabrication.
Figure 8:
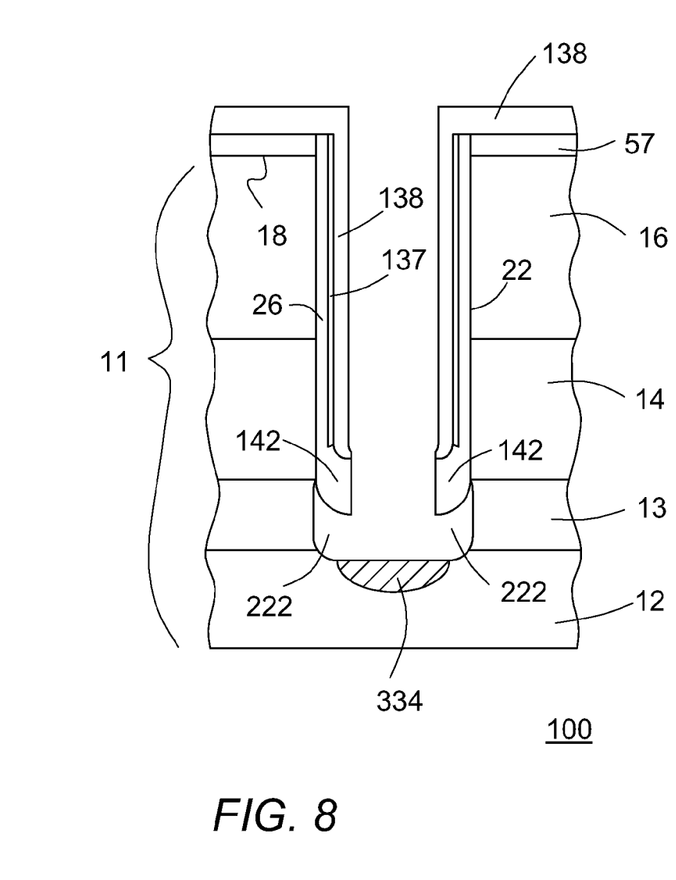

FIGS. 7-10 are partial cross-sectional views of a semiconductor structure or device 100 at various stages of fabrication in accordance with an alternative embodiment. Device 100 is similar to device 10, and similar elements are designated as being the same. Device 100 can be an alternative embodiment for forming source regions 33 and conductive regions 331. FIG. 7 is similar to FIG. 4 and shows device 100 after the second increment of trench 22 is formed. After the anisotropic dry etch is used to remove portions of semiconductor layer 13, an isotropic etch can be used to form portions 222. Portions 222 extend laterally into semiconductor layer 13 and undercut portions 142 of dielectric region 141. FIG. 8 shows device 100 after the formation of conductive region 334 in the floor portion of trench 22, which can be formed as described in conjunction with FIG. 5.

Figure 9:
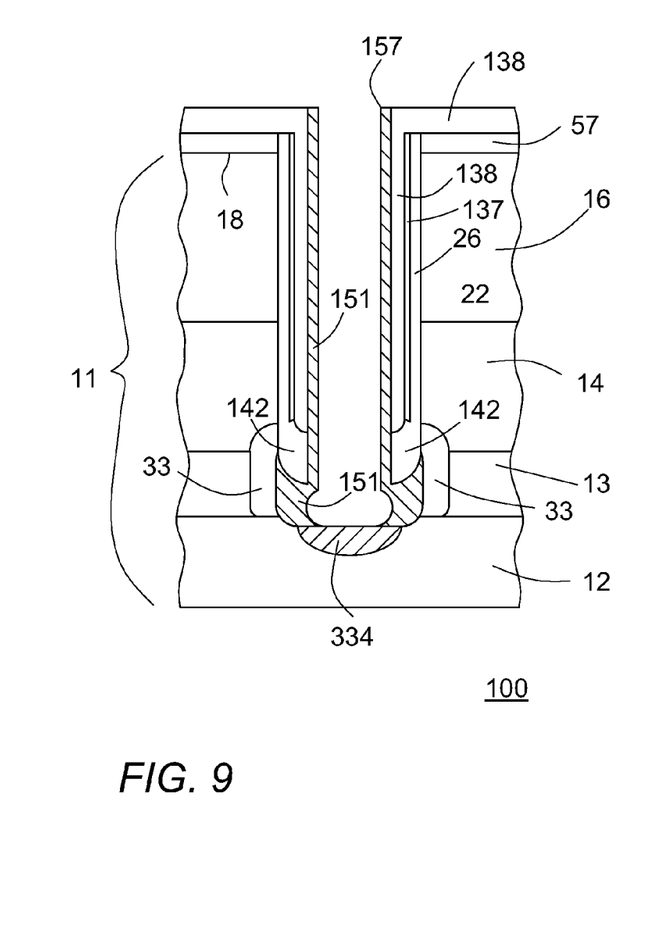

FIG. 9 is a partial cross-sectional view of device 100 after spacers 151 have been formed. In one embodiment, a conformal layer of material can be deposited overlying device 100 and within trench 22. The conformal layer can then be anisotropically etched to remove material from the upper surface of device 100 and the floor portion of trench 22. In one embodiment, spacers 151 can comprise n+ type polysilicon. Next, n type dopant from spacers 151 can be diffused from spacers 151 into semiconductor layer 13 (or body contact layer 36) and partially into semiconductor layer 14 (or PHV region 31) to form source regions 33. In accordance with this embodiment, spacers 151 provide for less n type dopant diffusion into conductive region 334 and semiconductor substrate 12.

Figure 10:
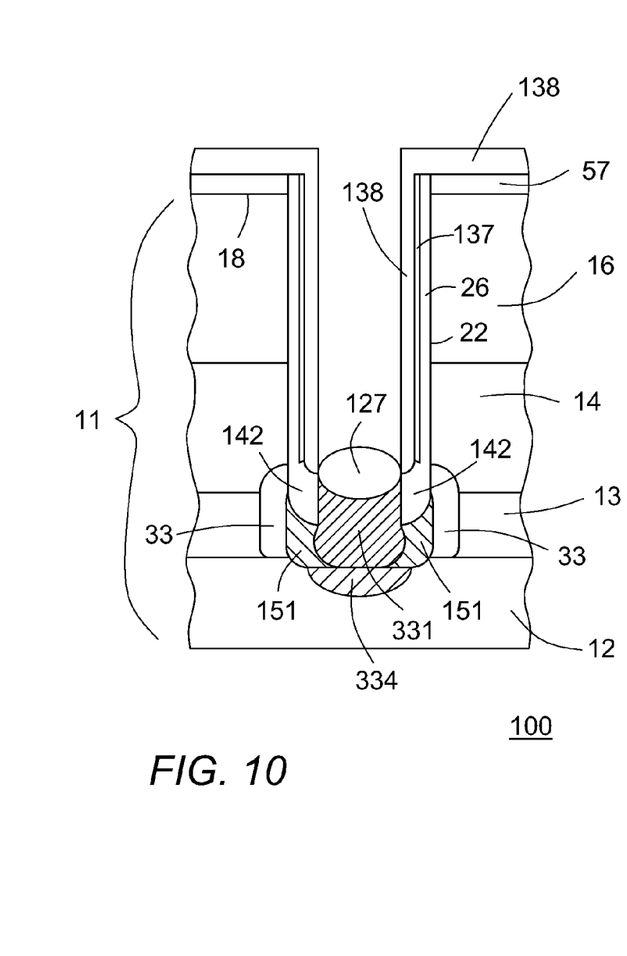

FIG. 10 is a partial cross-sectional view of device 100 after conductive layer 331 and dielectric region 127 have been formed. By way of example, conductive layer 331 is formed adjacent spacers 151 and also adjacent the floor portion of trench 22. In one embodiment, n+ type polysilicon is formed within trench 22 and then can be recessed to a location proximate to portions 142 of dielectric region 141 as described, for example, in conjunction with FIG. 6. Dielectric region 127 can then be formed adjacent to conductive layer 331 as described, for example, in conjunction with FIG. 6.

Figure 11:
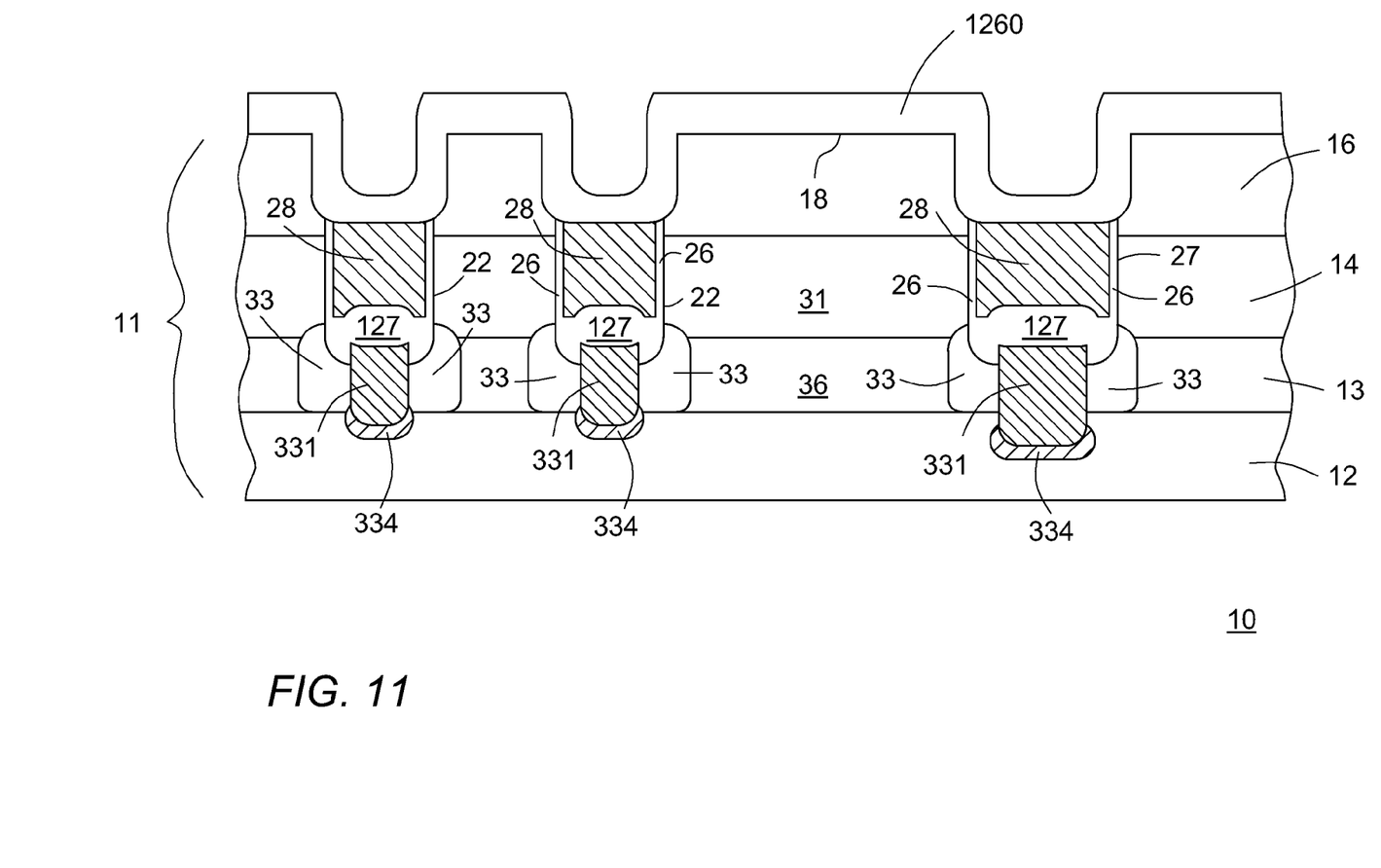
FIGS. 11-12 illustrate partial cross-sectional views of the semiconductor structure of FIG. 6 at further stages of fabrication.
Figure 12:
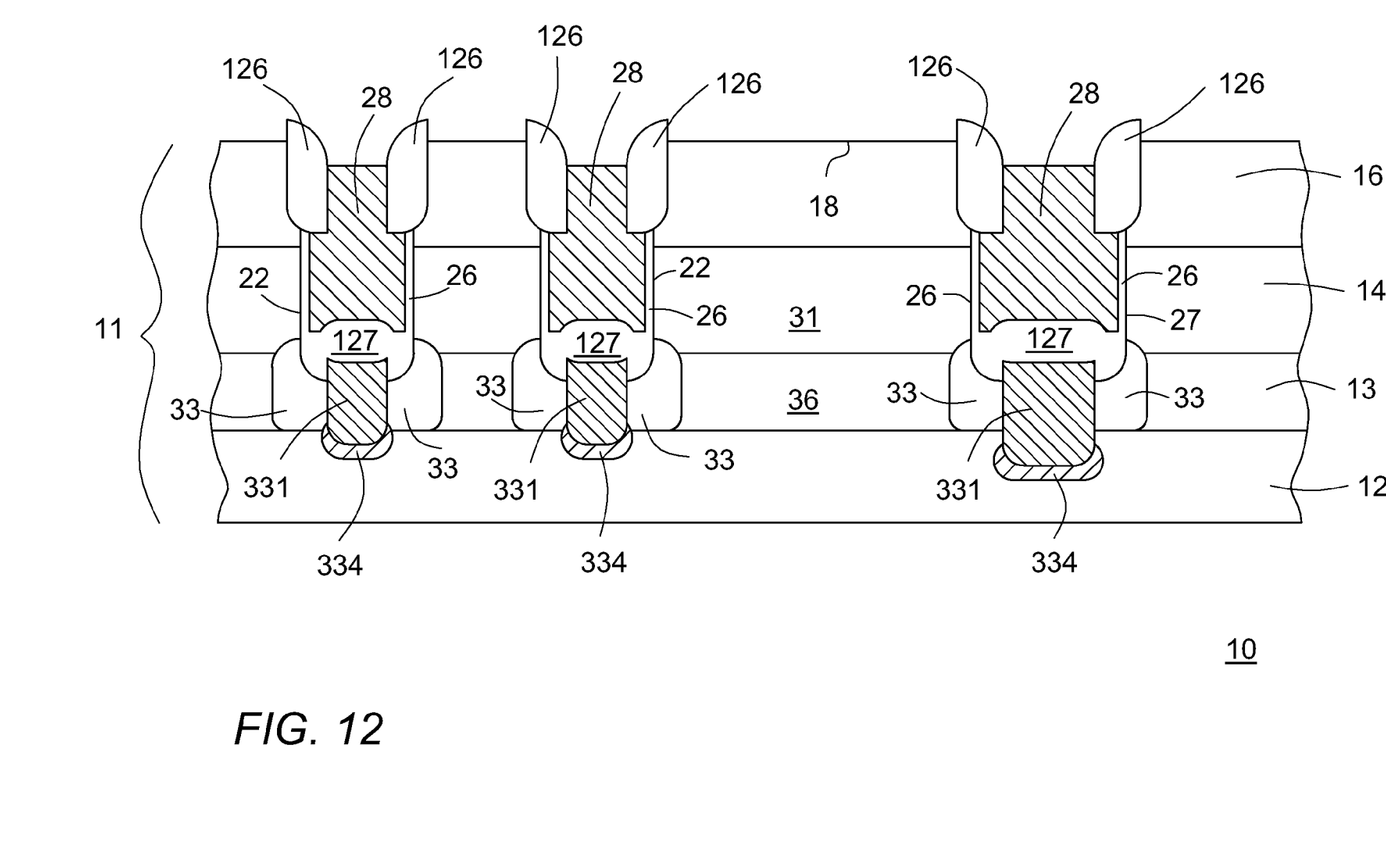

FIG. 11 is a partial cross-sectional view of device 10 after additional processing. FIG. 11 further shows contact trench structure 270, which can be formed using the same steps as those described thus far for the active devices. Contact trench structure 270 can have a width wider than trench structures 220 to provide for, for example, contact to gate electrodes 28. Dielectric layer 138 and hard mask layer 57 can be removed. Next, a conductive layer can be formed within trenches 22 and 27 to form gate electrodes 28. In one embodiment, an n+ type polysilicon layer is formed overlying major surface 18 and within trenches 22 and 27. The polysilicon can then be recessed or removed in part to leave gate electrodes 28 within trenches 22 and 27. In one embodiment, a dry etch using hydrogen bromide can be used to remove and/or recess the polysilicon material. Next, a dielectric layer 1260 is formed overlying major surface 18 and within trenches 22 and 27. In one embodiment, dielectric layer 1260 can be silicon oxide and can have a thickness from about 0.1 microns to about 0.2 microns. In one embodiment, dielectric layer 1260 can be a thermal oxide. In another embodiment, dielectric layer 1260 can be a deposited oxide. An anisotropic etch can be used to remove portions of dielectric layer 1260 overlying major surface 18 and overlying gate electrodes 28 to form dielectric regions or spacers 126 within trenches 22 and 27 as shown in FIG. 12.

Figure 13:
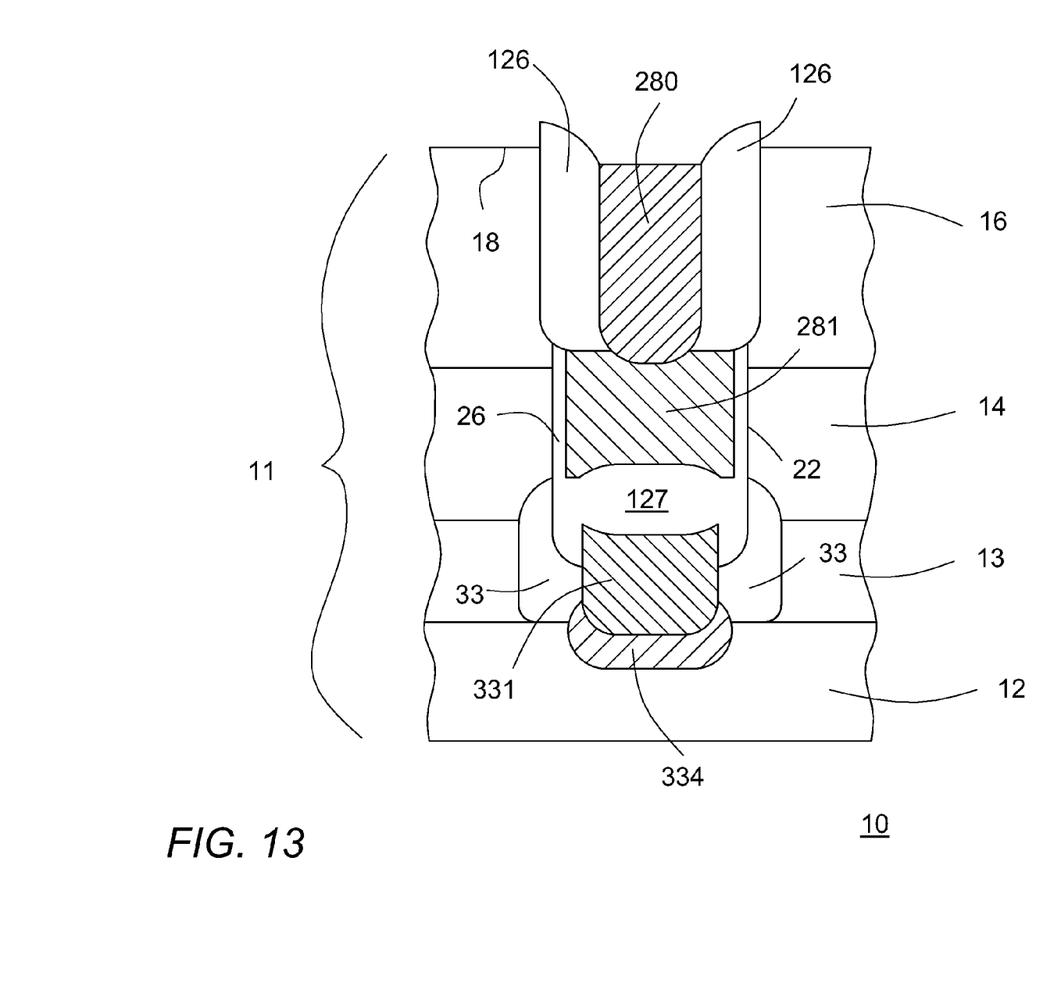
FIG. 13 illustrates a partial cross-sectional view of a semiconductor structure in accordance with a further embodiment of the present invention.

In one embodiment, additional n+ type polysilicon material can be formed within upper portions of trenches 22 and 27 adjacent dielectric regions 126 using steps similar to those described for forming gate electrodes 28. This upper portion of gate electrodes 28 and dielectric regions 126 can function as field plates for device 10, which enhances $BV_{DSS}$. In another embodiment, gate electrode 28 includes a portion 281 that comprises polysilicon and a portion 280 that comprises a metal or metal silicide as shown in FIG. 13. Portion 280 can be formed adjacent dielectric regions 126. In one embodiment, portion 280 can comprise tungsten silicide or the like.

Figure 14:
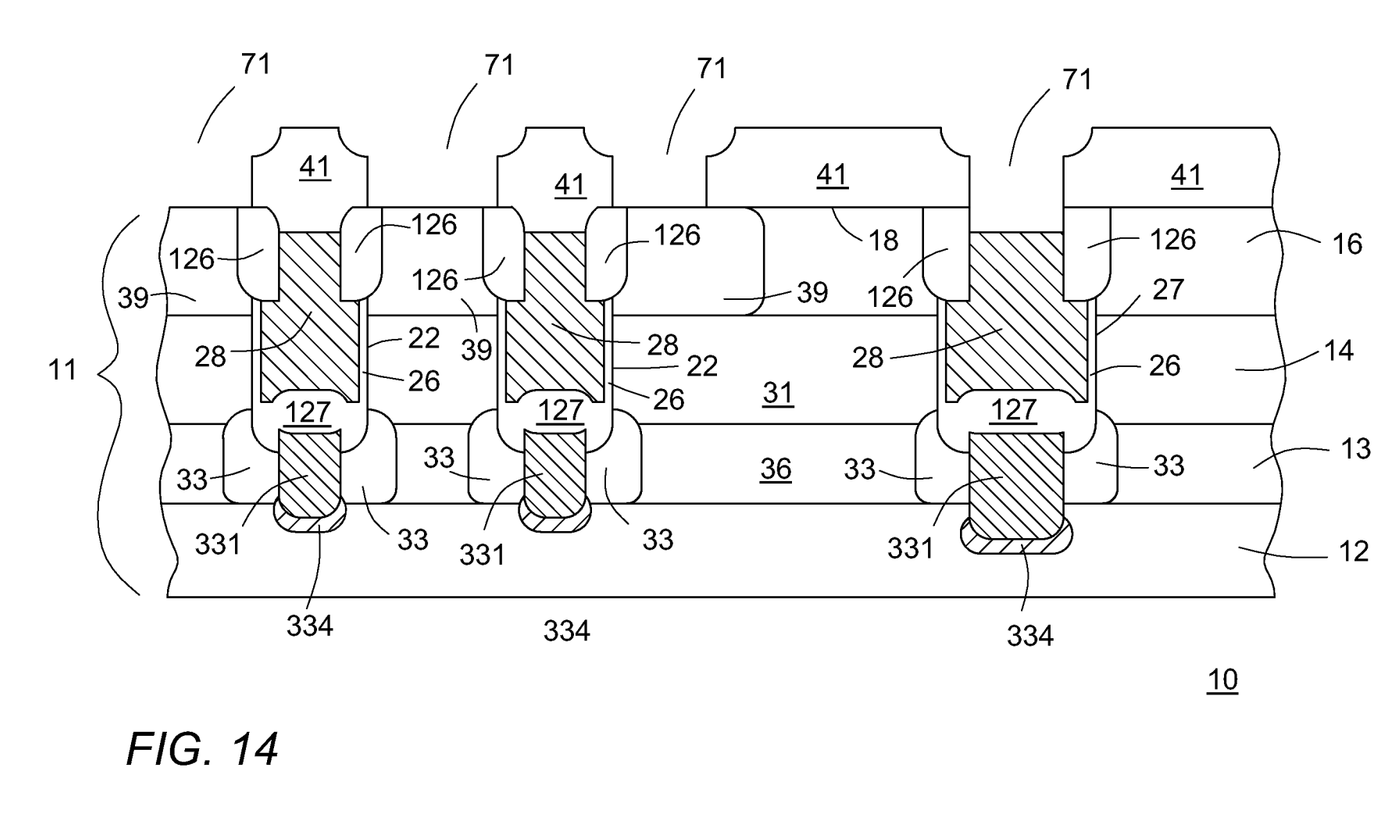
FIG. 14 illustrates a partial cross-section view of the semiconductor device of FIG. 12 after additional processing.

FIG. 14 is a partial cross-sectional view of device 10 after subsequent processing steps. Dielectric layer 41 can be formed overlying major surface 18. In one embodiment, dielectric layer 41 comprises a silicon oxide and can have a thickness from about 0.4 microns to about 1.0 microns. In one embodiment, dielectric layer 41 comprises a deposited silicon oxide doped with phosphorous or boron and phosphorous. In one embodiment, dielectric layer 41 can be planarized to provide a more uniform surface topography. In a second masking step in accordance with the present embodiment, dielectric layer 41 is patterned and etched to form contact openings 71 along segments of major surface 18 and trench 27. Next, in one embodiment a series of n type ion implants are used to form drain regions 39 within semiconductor layer 16. In one embodiment, drain regions 39 extend to a location proximate to the interface between semiconductor layers 16 and 14. In one embodiment, the series of ion implants can include implants of n-type dopant that decrease in dose and increase in energy to provide a graded dopant profile. In another embodiment, the series of ion implants can include implants of n-type dopant that increase in dose and decrease in energy to provide the graded dopant profile. The ion implants can then be annealed to form drain regions 39.

Next, a conductive layer can be formed overlying major surface 18. In a third masking step in accordance with the present embodiment, the conductive layer can be patterned and etched to form conductive regions 43 and 44 as shown in and described in conjunction with FIG. 1. Substrate 12 of region of semiconductor material 11 can be thinned, and conductive layer 46 can then be formed overlying the surface of substrate 12 opposite to major surface 18 as shown in and described in conjunction with FIG. 1.

From all of the foregoing, one skilled in the art can determine that according to one embodiment, a semiconductor device comprises a semiconductor substrate (for example, element 12) of first conductivity type. A first semiconductor layer (for example, element 13) of the first conductivity type configured as a body contact layer (for example, element 36) is formed overlying the semiconductor substrate. A second semiconductor layer (for example, element 14) of the first conductivity type and configured as a body layer (for example, element 31) is formed overlying the body contact layer. A trench structure (for example, element 220) is formed within the first and second semiconductor layers and a portion of the semiconductor substrate. The trench structure includes a trench (for example, element 22), a metal contact (for example, element 334) formed adjacent a floor portion of the trench and adjacent the semiconductor substrate, a source contact (for example, element 331) formed within the trench and adjacent the metal contact and adjacent the first semiconductor layer, and a gate electrode (for example, elements 28, 280, 281) formed within the trench and insulated from the first and second semiconductor layers by a gate dielectric layer (for example, element 26). The gate electrode is configured to form a channel (for example, element 45) within the second semiconductor layer. The trench structure also includes a first dielectric region (for example, elements 127, 141, 142) insulating the gate electrode from the source contact. The semiconductor device includes a first doped region (for example, element 33) of a second conductivity type opposite the first conductivity type formed within the first semiconductor layer adjacent the source contact. The metal contact electrically shorts the source contact, the first doped region and the substrate.

Those skilled in the art will also appreciate that according to another embodiment, the device described in the preceding paragraph further includes a third semiconductor layer formed overlying the second semiconductor layer. In one embodiment, the third semiconductor layer comprises the first conductivity type. In another embodiment, the third semiconductor layer comprises the second conductivity type.

Those skilled in the art will also appreciate that according to another embodiment, the trench structure in the device described in paragraph [0039] further includes a second dielectric region (for example, element 126) formed along upper surfaces of the trench and adjacent to the drain region, wherein the gate electrode is further formed adjacent the second dielectric region, and wherein the second dielectric region is thicker than the gate dielectric layer.

Those skilled in the art will also appreciate that according to an additional embodiment, a method for forming a semiconductor device includes providing a semiconductor substrate (for example, element 12) having a first semiconductor layer (for example, element 13) formed overlying the semiconductor substrate, a second semiconductor layer (for example, element 14) formed overlying the first semiconductor layer, and a third semiconductor layer (for example, element 16) formed overlying the second semiconductor layer, wherein the semiconductor substrate and the first and second semiconductor layers have a first conductivity type, and wherein the third semiconductor layer has either the first conductivity type or a second conductivity type opposite to the first conductivity type. The method includes forming a trench (for example, element 22) extending through the first, second, and third semiconductor layers and a portion of the semiconductor substrate and forming a conductive contact (for example, element 334) adjacent a floor portion of the trench and the semiconductor substrate. The method includes forming a source contact (for example, element 331) adjacent the conductive contact and the first semiconductor layer and forming a source region (for example, element 33) having a second conductivity type within the first semiconductor layer, where the source contact and the source region are adjacent. The method includes forming an insulated gate electrode (for example, elements 26, 28, 127) adjacent the source contact and the first, second, and third semiconductor layers, wherein the insulated gate electrode is configured to form a channel region (for example, element 45) within the second semiconductor layer. The conductive contact electrically shorts the source contact and the source region to the semiconductor substrate and the first semiconductor layer.

Those skilled in the art will also appreciate that according to a further embodiment, the step of forming the insulated gate electrode in the method described in preceding paragraph includes forming the insulated gate electrode comprising a conductive gate electrode (for example, elements 28, 280, 281) insulated from at least a portion of the second semiconductor layer by a gate dielectric layer (for example, element 26) and is insulated from at least a portion of the third semiconductor layer by a dielectric region (for example, element 126) that is thicker than the gate dielectric layer.

Those skilled in the art will also appreciate that according to a further embodiment, a method for forming a semiconductor device having a source-substrate connection comprises the steps of providing a semiconductor substrate (for example, element 12) having a first semiconductor layer (for example, element 13) formed overlying the semiconductor substrate, a second semiconductor layer (for example, element 14) formed overlying the first semiconductor layer, and a third semiconductor layer (for example, element 16) formed overlying the second semiconductor layer, wherein the semiconductor substrate and the first, second, and third semiconductor layers have a first conductivity type. The method includes forming a trench (for example, element 22) extending into the first, second, and third semiconductor layers and forming a conductive contact (for example, element 334) adjacent a floor portion of the trench and the semiconductor substrate. The method includes forming a source contact (for example, element 331) adjacent the conductive contact and the first semiconductor layer, wherein the source contact comprises a plug of polycrystalline semiconductor material. The method includes forming a source region (for example, element 33) having a second conductivity type within the first semiconductor layer, wherein the source contact and the source region are adjacent, and forming a drain region (for example, element 39) having the second conductivity type within the third semiconductor layer. The method includes forming an insulated gate electrode (for example, elements 26, 28) adjacent the second semiconductor layer, wherein the insulated gate electrode is configured to form a channel region (for example, element 45) within the second semiconductor layer, and wherein the insulated gate electrode includes a conductive gate electrode (for example, element 28, 280, 281) insulated from at least a portion of the second semiconductor layer by a gate dielectric layer (for example, element 26), and wherein the conductive gate electrode is insulated from at least a portion of the drain region by a dielectric region (for example, element 126) that is thicker than the gate dielectric layer, and wherein the conductive contact electrically shorts the source contact and the source region to the semiconductor substrate.

In view of all the above, it is evident that a novel source-down configured device and method is disclosed. Included, among other features, is a trench formed in a region of semiconductor material. The region of semiconductor material includes a substrate of a first conductivity type and a plurality of semiconductor layers of the first conductivity type formed overlying the substrate. A conductive region is formed adjacent to a floor portion of the trench. A conductive source contact region is formed within the trench adjacent the conductive region. Dopant material of a second conductivity type can be laterally diffused from the conductive source contact into one of the semiconductor layers, which is configured as a body contact layer, to form source regions. The source regions can also adjoin a second semiconductor layer, which is configured as a PHV or body region. The conductive region is configured to short the substrate, the conductive source contact and the source regions together. The conductive region comprises a material that can withstand the elevated temperatures that may be required in subsequent steps used to manufacture the device. The device can be manufactured using as few as three (3) photo-masking steps. In an additional embodiment, thick dielectric regions can be formed along upper portions trench adjacent the drain region. Portions of the gate electrode are formed adjacent the thick dielectric regions, which forms a field plate to enhance breakdown voltage performance and reduce gate-to-drain capacitance.

Although the subject matter of the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications that fall within the scope of the appended claims.

We claim:

1. A semiconductor device comprising:
    a semiconductor substrate of first conductivity type;
    a first semiconductor layer of the first conductivity type configured as a body contact layer overlying the semiconductor substrate;
    a second semiconductor layer of the first conductivity type configured as a body layer overlying the body contact layer;
    a trench structure formed within the first and second semiconductor layers and a portion of the semiconductor substrate, wherein the trench structure includes:
    a trench;
    a metal contact adjacent a floor portion of the trench and adjacent the semiconductor substrate;
    a source contact within the trench and adjacent the metal contact and adjacent the first semiconductor layer;
    a gate electrode within the trench and insulated from the first and second semiconductor layers by a gate dielectric layer, wherein the gate electrode is configured to form a channel within the second semiconductor layer; and
    a first dielectric region insulating the gate electrode from the source contact; and
    a first doped region of a second conductivity type opposite to the first conductivity type within the first semiconductor layer adjacent the source contact, wherein the first doped region abuts the semiconductor substrate, and wherein the metal contact electrically shorts the source contact, the first doped region and the semiconductor substrate.

2. The device of claim 1, wherein the body contact layer has a higher dopant concentration than that of the body layer, and wherein the first doped region is configured as a source region.

3. The device of claim 1 further comprising a third semiconductor layer overlying the second semiconductor layer.

4. The device of claim 3, wherein the third semiconductor layer comprises the first conductivity type, and wherein the semiconductor device further comprises a second doped region of the second conductivity type within the third semiconductor layer and adjacent the trench, and wherein the second doped region is configured as a drain region.

5. The device of claim 4, wherein the drain region has a graded dopant profile.

6. The device of claim 4, wherein the trench structure further includes a second dielectric region along upper surfaces of the trench and adjacent to at least a portion of the drain region, and wherein the gate electrode is adjacent the second dielectric region, and wherein the second dielectric region is thicker than the gate dielectric layer.

7. The device of claim 6, wherein the gate electrode includes a first portion that comprises polysilicon and second portion that comprises a metal, and wherein the second portion is adjacent the second dielectric region.

8. The device of claim 1, wherein the metal contact comprises a metal silicide.

9. The device of claim 1, wherein the source contact comprises a polycrystalline semiconductor material.

10. The device of claim 9, wherein the source contact comprises polysilicon doped with a dopant of the second conductivity type.

11. The device of claim 1 further comprising a barrier layer within the trench and between the semiconductor substrate and the source contact.

12. A method of forming a semiconductor device comprising the steps of:
providing a semiconductor substrate having a first semiconductor layer formed overlying the semiconductor substrate, a second semiconductor layer formed overlying the first semiconductor layer, and a third semiconductor layer formed overlying the second semiconductor layer, wherein the semiconductor substrate and the first and second semiconductor layers have a first conductivity type, and wherein the third semiconductor layer has either the first conductivity type or a second conductivity type opposite to the first conductivity type;
forming a trench extending through the first, second, and third semiconductor layers and a portion of the semiconductor substrate;
forming a conductive contact adjacent a floor portion of the trench and the semiconductor substrate;
forming a source contact adjacent the conductive contact and the first semiconductor layer;
forming a source region having the second conductivity type within the first semiconductor layer, wherein the source contact and the source region are adjacent; and
forming an insulated gate electrode adjacent the source contact and the first, second and third semiconductor layers, wherein the insulated gate electrode is configured to form a channel region within the second semiconductor layer, and wherein the conductive contact electrically shorts the source contact and the source region to the semiconductor substrate.

13. The method of claim 12, wherein the step of forming the conductive contact includes forming the conductive contact self-aligned to the floor portion of the trench.

14. The method of claim 12, wherein the step of forming the conductive contact includes forming a metal silicide contact.

15. The method of claim 12, wherein the step of forming the source contact includes forming a plug of polycrystalline semiconductor material.

16. The method of claim 12, wherein the step of forming the source region includes the step of diffusing dopant from the source contact into the first semiconductor layer.

17. The method of claim 12, wherein the step of forming the insulated gate electrode includes forming the insulated gate electrode comprising a conductive gate electrode insulated from at least a portion of the second semiconductor layer by a gate dielectric layer and insulated from at least a portion of the third semiconductor layer by a dielectric region that is thicker than the gate dielectric layer.

18. A method for forming a semiconductor device having a source-substrate connection comprising the steps of:
providing a semiconductor substrate having a first semiconductor layer formed overlying the semiconductor substrate, a second semiconductor layer formed overlying the first semiconductor layer, and a third semiconductor layer formed overlying the second semiconductor layer, wherein the semiconductor substrate and the first, second, and third semiconductor layers have a first conductivity type;
forming a trench extending into the first, second, and third semiconductor layers;
forming a conductive contact adjacent a floor portion of the trench and the semiconductor substrate;
forming a source contact adjacent the conductive contact and the first semiconductor layer, wherein the source contact comprises a plug of polycrystalline semiconductor material;
forming a source region having a second conductivity type within the first semiconductor layer, wherein the source contact and the source region are adjacent;
forming a drain region having the second conductivity type within the third semiconductor layer; and
forming an insulated gate electrode adjacent the second semiconductor layer, wherein the insulated gate electrode is configured to form a channel region within the second semiconductor layer, and wherein the insulated gate electrode includes a conductive gate electrode insulated from at least a portion of the second semiconductor layer by a gate dielectric layer, and wherein the conductive gate electrode is insulated from at least a portion of the drain region by a dielectric region that is thicker than the gate dielectric layer, and wherein the conductive contact electrically shorts the source contact and the source region to the semiconductor substrate.

19. The method of claim 18, wherein the step of forming the source region includes diffusing dopant from the source contact into the first semiconductor layer.

20. The method of claim 18, wherein the step of forming the drain region comprises forming the drain region with a plurality of ion implants.

* * * * *